(12) United States Patent
Nair et al.

(10) Patent No.: US 7,952,194 B2
(45) Date of Patent: May 31, 2011

(54) SILICON INTERPOSER-BASED HYBRID VOLTAGE REGULATOR SYSTEM FOR VLSI DEVICES

(75) Inventors: Raj Nair, Gilbert, AZ (US); Johanna Swan, Scottsdale, AZ (US); Bala Natarajan, Phoenix, AZ (US); Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 2763 days.

(21) Appl. No.: 10/016,793

(22) Filed: Oct. 26, 2001

(65) Prior Publication Data
US 2003/0081389 A1 May 1, 2003

(51) Int. Cl.
H01L 23/34 (2006.01)

(52) U.S. Cl. ........................................ 257/723; 361/704

(58) Field of Classification Search .................. 257/686, 257/777, 774, 724, 723, 790, 707, 778, 691, 257/704, E21.503, E23.064, E23.104; 323/282, 323/284; 361/760, 718, 736, 794, 803, 836, 361/91.1, 93.4, 97, 90, 719, 735, 704; 438/108, 438/118, 671, 667; 363/147, 50
See application file for complete search history.

(56) References Cited

U.S. PATENT DOCUMENTS

| | | | |
|---|---|---|---|
| 5,955,870 A | 9/1999 | Nair | |
| 6,081,105 A | 6/2000 | Nair | |
| 6,137,164 A * | 10/2000 | Yew et al. | 257/686 |
| 6,262,905 B1 * | 7/2001 | Zhang et al. | 363/127 |
| 6,264,476 B1 * | 7/2001 | Li et al. | 439/66 |
| 6,265,771 B1 * | 7/2001 | Ference et al. | 257/706 |
| 6,366,467 B1 * | 4/2002 | Patel et al. | 361/760 |
| 6,396,137 B1 * | 5/2002 | Klughart | 257/691 |
| 6,521,530 B2 * | 2/2003 | Peters et al. | 438/667 |

* cited by examiner

Primary Examiner — Rajnikant B Patel
(74) Attorney, Agent, or Firm — Kenyon & Kenyon LLP

(57) ABSTRACT

A voltage regulation module and system for an integrated circuit die. The voltage regulation module includes an interposer situated in a stack between a substrate and the integrated circuit die. The interposer includes a hybrid array of voltage regulation elements for receiving voltage from the power supply and for down-converting the voltage from the power supply into a regulated voltage supplied to the integrated circuit die. The hybrid array of voltage regulation elements includes both high-bandwidth linear regulation elements for providing voltage regulation to areas on the integrated circuit die that intermittently demand relatively high current levels, and low-bandwidth switching regulator elements that are highly power efficient.

20 Claims, 4 Drawing Sheets

SILICON INTERPOSER-BASED HYBRID VOLTAGE REGULATOR SYSTEM FOR VLSI DEVICES

FIELD OF THE INVENTION

The present invention relates to integrated circuit devices and more particularly, but without limitation, relates to power delivery for such devices.

BACKGROUND INFORMATION

The use of complementary metal oxide semiconductors (CMOS) in integrated circuits has facilitated reduction in the amount of power required for standard operation and has accordingly allowed chip designers to reduce the standard supply voltage provided to integrated circuits down to a single volt (1 V). At the same time the operational voltages are being scaled down, chip power usage is actually increasing with the greater frequencies and numbers of transistors in high-performance circuits. According to ohm's law (Power=Voltage× Current), if power is increasing while voltage is decreasing, current must be increasing at a high rate to both match the increasing power while compensating for the decrease in voltage. These high current levels place increasing demands on the voltage regulation systems that provide power to the VLSI circuits.

To provide for such voltage regulation, very large scale integrated circuit (VLSI) designers have developed voltage regulation modules (VRMs) that are employed in a system in conjunction with VLSI circuit dies. A conventional arrangement of a voltage regulation system, illustrated in FIG. 1, shows a VRM module 20 placed adjacent to a VLSI circuit die 10, with both the VRM module 20 and the VLSI circuit 10 stacked on a substrate 5. The VLSI 10 and VRM module are equipped with respective heat sinks 15, 25 and are respectively coupled to the substrate via interconnect wires or solder elements 12, 22. The VRM module 20 is connected to the VLSI via interconnect wires that run through the substrate 5. The substrate is in turn coupled to external interfaces (not shown) via solder ball elements 8.

Two problems associated with implementation of voltage regulation in high-performance circuits are on-die di/dt voltage "droops", which occur when an immediate demand for current at a localized region of the VLSI die causes a sudden drop in the supply voltage; and IR and Ldi/dt voltage drops, which occur as current is transported over interconnect lines between voltage regulation modules (VRMs) and the VLSI die. In the conventional arrangement of FIG. 1, the placement of the VRM module 20 adjacent to the VLSI assembly 10 on the substrate 5 helps minimize the IR and Ldi/dt voltage drops because of the close proximity between the VRM module and the VLSI die. However, optimal voltage regulation using the conventional arrangement can be impaired by power delivery interconnect bottlenecks between the VRM and the VLSI assembly. In addition, adjacent placement of the VRM module and the VLSI assembly concentrates VRM functionality in a single location, which can cause sub-optimal use of the resources of the VRM system.

DETAILED DESCRIPTION

In accordance with the present invention, a stacked-die approach is used for integrating voltage regulator modules with VLSI chips to minimize IR voltage drops in high current delivery pathways at low voltages. In the stacked-die approach a silicon interposer layer is stacked so that it adjoins and faces a VLSI circuit or processer die. The two-dimensional interface and minimal separation distance between the interposer layer and the VLSI die helps ensure minimal IR voltage drops and eliminates supply bottlenecks. Within the interposer layer, a hybrid voltage regulator array arrangement assists in the minimization of on-die voltage droops in high di/dt events. The array includes relatively fast, high-bandwidth linear regulators and relatively slower, but more efficient low-bandwidth switching regulators. By positioning linear regulators in so-called 'hot spots' on the VLSI die that intermittently demand high current levels, rapid adjustments in voltage supply levels can be achieved, reducing the magnitude of the di/dt voltage droops.

Figure 1:
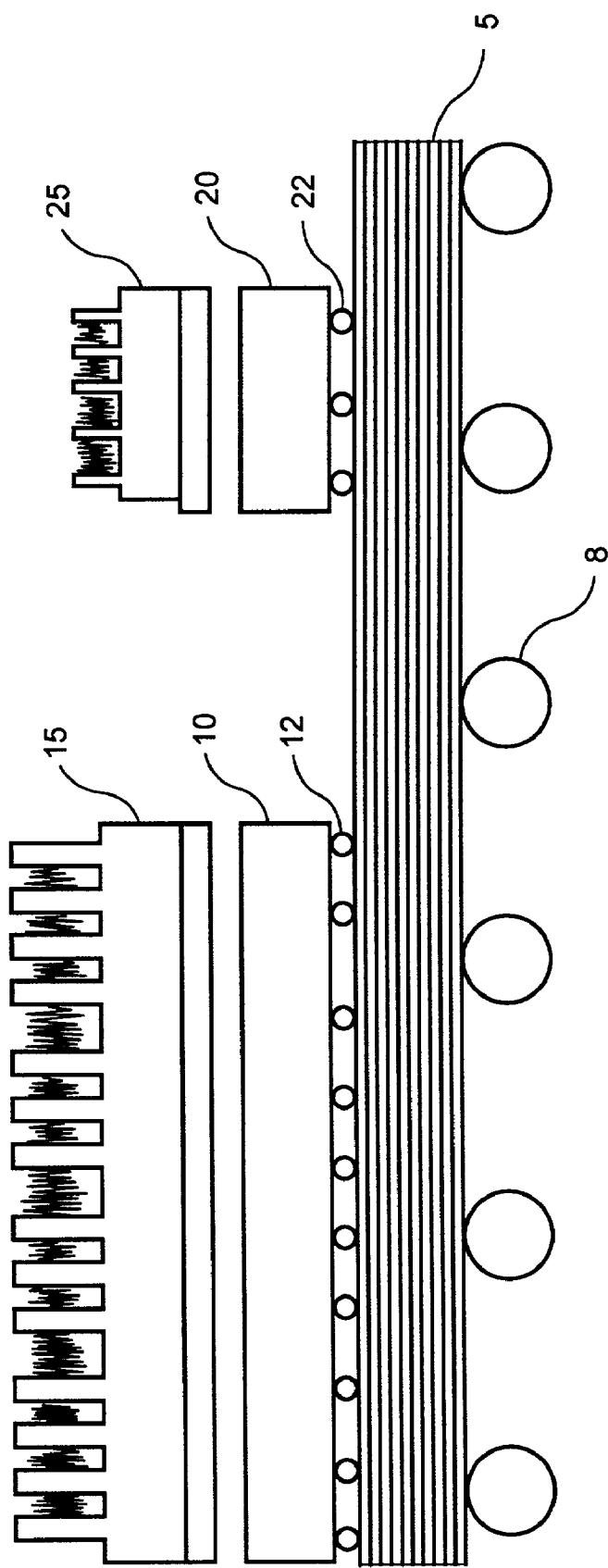
FIG. 1 is a block diagram showing a cross-section of a conventional system for voltage regulation of a VLSI circuit.
Figure 2A:
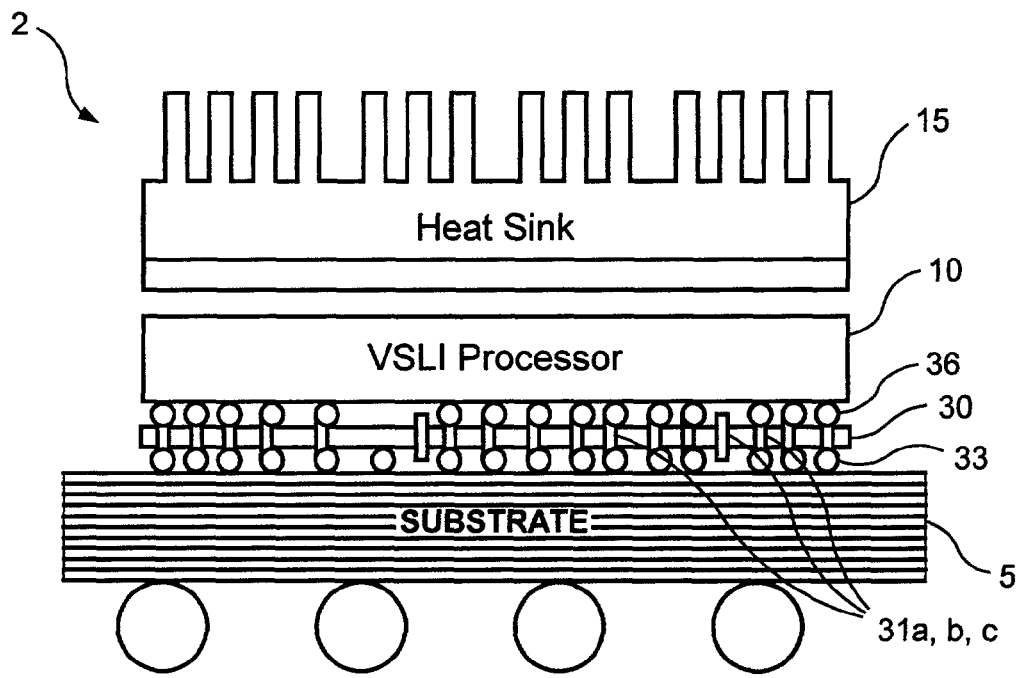
FIG. 2A is a block diagram showing a cross-section of a VLSI voltage regulation system according to an embodiment of the present invention.

FIG. 2A illustrates an embodiment of the VLSI assembly with voltage regulation according to the present invention. As shown, a VLSI assembly 2 includes a substrate 5, which may be a motherboard or a chip board that contains numerous interconnect lines connecting to other devices not shown, such as, for example, a power supply, input/output devices, and other processor units. On top of the substrate is a thin interposer layer 30, made from a semiconductor such as silicon. Given current microfabrication techniques, the width of the interposer layer 30 can be as small as 50 microns, but is not limited thereby. The semiconductor interposer layer 30 contains active voltage regulator elements, described in further detail below, and passive components including metal-insulator-metal capacitors. The side of the interposer layer 30 facing the substrate 5, denoted the "back" side, is coupled to the substrate via solder ball connectors 33, and receives the power supply voltage therefrom.

The opposite side of the interposer layer 30, denoted the "circuit" side, is bonded in a flip-chip fashion, i.e., circuit-side to circuit-side, with VLSI die 10. In the embodiment shown the circuit side of the interposer layer 30 maps approximately 1 to 1 with the VLSI circuit die 10, i.e., they have the same surface dimensions. The circuit side of the interposer layer 30 can be coupled to the VLSI die 10 by flip-chip solder bump connectors 36 and any other VLSI interconnect layers that may be included on the VLSI die 10. Alternatively, the interposer layer 30 can be coupled to the VLSI die by copper-to-copper interconnects as known in the art. The VLSI die 10 is in turn coupled to a heat sink 15 which prevents circuit damage by diffusing excessive heat energy from the VLSI die. The voltage regulator elements of the interposer layer 30 convert a higher supply voltage to a lower voltage that is then output to the power grid of the VLSI die 10 via the connectors 36. Since the voltage regulators within the interposer layer 30 are separated from the circuits on the VLSI die 10 only by the distance covered by the solder bumps 36 which are typically or copper-to-copper interconnects, that can be on the order of a few microns in length, the lowered-voltage supply can be distributed very close to the circuits on the VLSI die, minimizing IR and Ldi/dt voltage drops. The copper-to-copper interconnects also provide for a high level of thermal conductivity between the interposer layer 30 and the VLSI die 10.

Figure 2B:
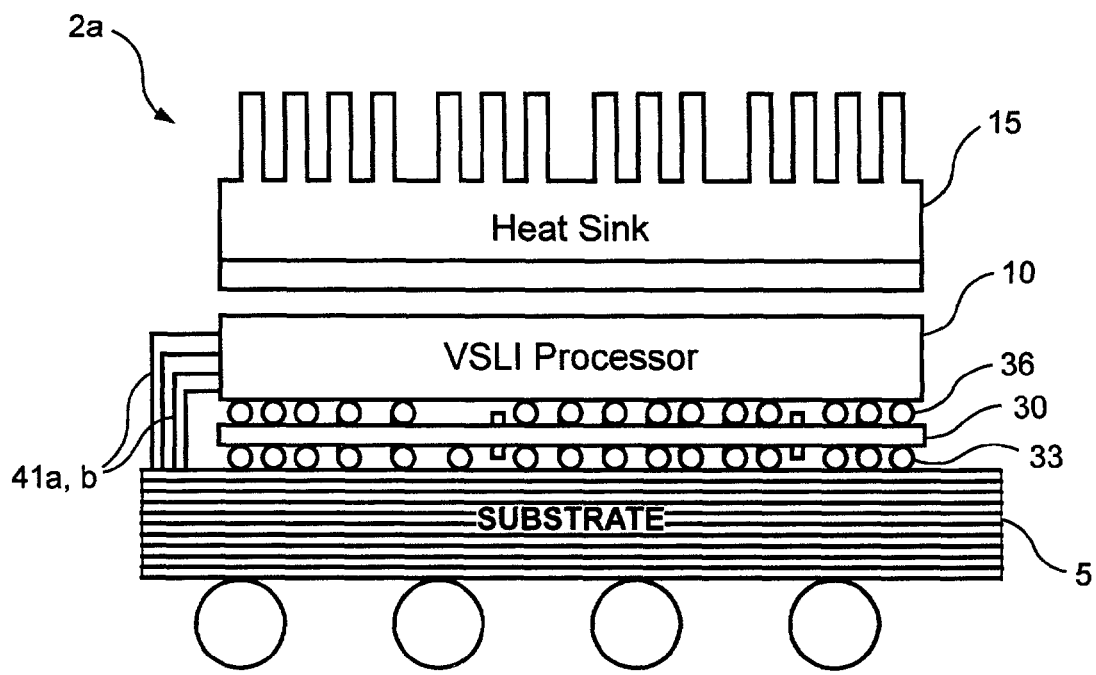
FIG. 2B is a block diagram showing a cross-section of a VLSI voltage regulation system according to a second embodiment of the present invention in which thru-vias do not traverse the interposer layer.
Figure 3:
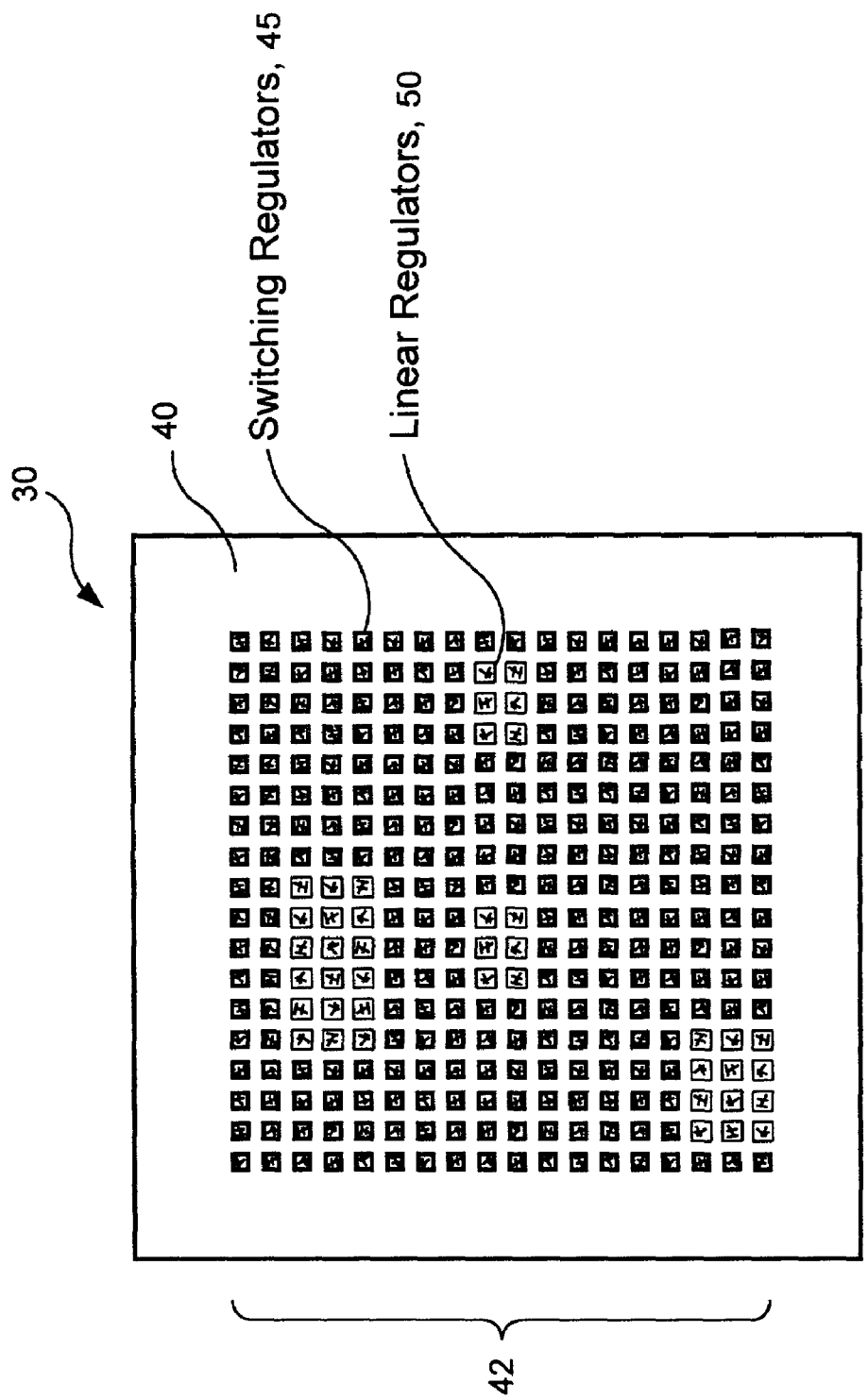
FIG. 3 is a schematic plan view of the two-dimensional hybrid array of the interposer layer according to an embodiment of the present invention.

Because the interposer layer 30 is positioned in between the substrate 5 and the VLSI die 10, the interposer layer is thinned to allow a set of thru-vias, such as 31a, b, c, to penetrate through the layer. The thru-vias 31a, b, c are interconnectors that traverse the entire interposer layer 30, while being insulated from the interposer. According to one embodiment of the voltage regulation system, the thru-vias 31a, b, c couple the VLSI die 10 directly to the substrate so that I/O data transmission operations can be conducted directly between the VLSI die and the substrate. As indicated in FIG. 3, the thru-vias are situated around the perimeter of the interposer layer 30 and do not affect the voltage regulation components of the interposer layer. FIG. 2B shows an alternative embodiment that does not include thru-vias. Instead, the substrate 5 and the VLSI die 10 are coupled via I/O interconnect wires, such as 41a, b that run beyond the edge of the interposer layer 30.

FIG. 3 shows a plan view of the circuit side of the interposer layer 30. As shown, the layer is square in profile, but the square shape is merely illustrative and rectangular shape that maps approximately 1:1 with the VLSI circuit die can be used. The interposer layer 30 includes a perimeter region 40 through which the thru-vias may protrude if they are used to directly interconnect the VLSI die with the substrate. Enclosed within the perimeter region 40 is a hybrid voltage regulator array 42. The hybrid regulator array 42, according to a first embodiment, includes groups of high-bandwidth linear voltage regulators 50 (shown as darkened squares) distributed among rows and columns of high-efficiency, low-bandwidth, switching regulators 45 (shown as light boxes). Within the array, passive devices such as metal-insulator-metal capacitors and high-bandwidth inductors may be interspersed with the linear 50 and switching regulators. The availability of these passive components in the interposer layer 30 can provide additional benefit to high-speed I/O circuits in the VLSI die through equalization circuit configurations employing these components.

The linear voltage regulators 50 may be, for example, of the type described in U.S. Pat. Nos. 5,955,870 and 6,081,105, which are small in size and can rapidly adjust to changes in supply voltage. Such regulators use a gating device such as an n-FET in series with the load current. The gate of the device is controlled by the difference between the required reference voltage level and the actual output voltage level via feedback. In this manner, the gate-source voltage, $V_{GS}$, responds immediately to drops in output voltage, enabling the device to rapidly supply current to fill any voltage deficiency during transient high di/dt events. The linear voltage regulators 50 have a high-bandwidth in that they are able to respond to the high-frequency components of immediate step-function current demands. The drawback of using linear voltage regulators 50 is that they dissipate power in proportion to the drain-source voltage $V_{DS}$ and are accordingly less power-efficient that switching regulators which function by switching a high input voltage for short durations into smoothing LC filters. The smoothing LC filters deliver the average voltage value determined as the product of the duty-cycle of the switching operation and the input voltage to a load. The principle of energy conservation allows for a large current to be delivered at a low output voltage from a small current input to the system at a high input voltage. The switching regulators have a lower bandwidth because their response to high-frequency components of current demand functions is limited.

Therefore, to maximize power efficiency, the linear voltage regulators 50 are more sparingly used in the array in comparison to switching regulators 45 and are distributed at strategic locations to regulate the voltage at "hot-spots" on the VLSI die, or at locations particularly sensitive to significant power supply voltage droops. This hybrid approach using linear regulators 50 at hot-spots also minimizes the need to include high-speed decoupling capacitors on the VLSI die, saving much-needed space for other types of components. In an alternative embodiment, the linear voltage regulators may be implemented within the VLSI die for cost reasons. However, in this case extra precautions may be required to make the integrated circuits tolerant to high voltages because the VLSI is designed to operate at low voltages (e.g., 1V), and the direct transmission of high input supply voltages (e.g., 5V) to the VLSI die raises reliability concerns for devices within the die.

Figure 4:
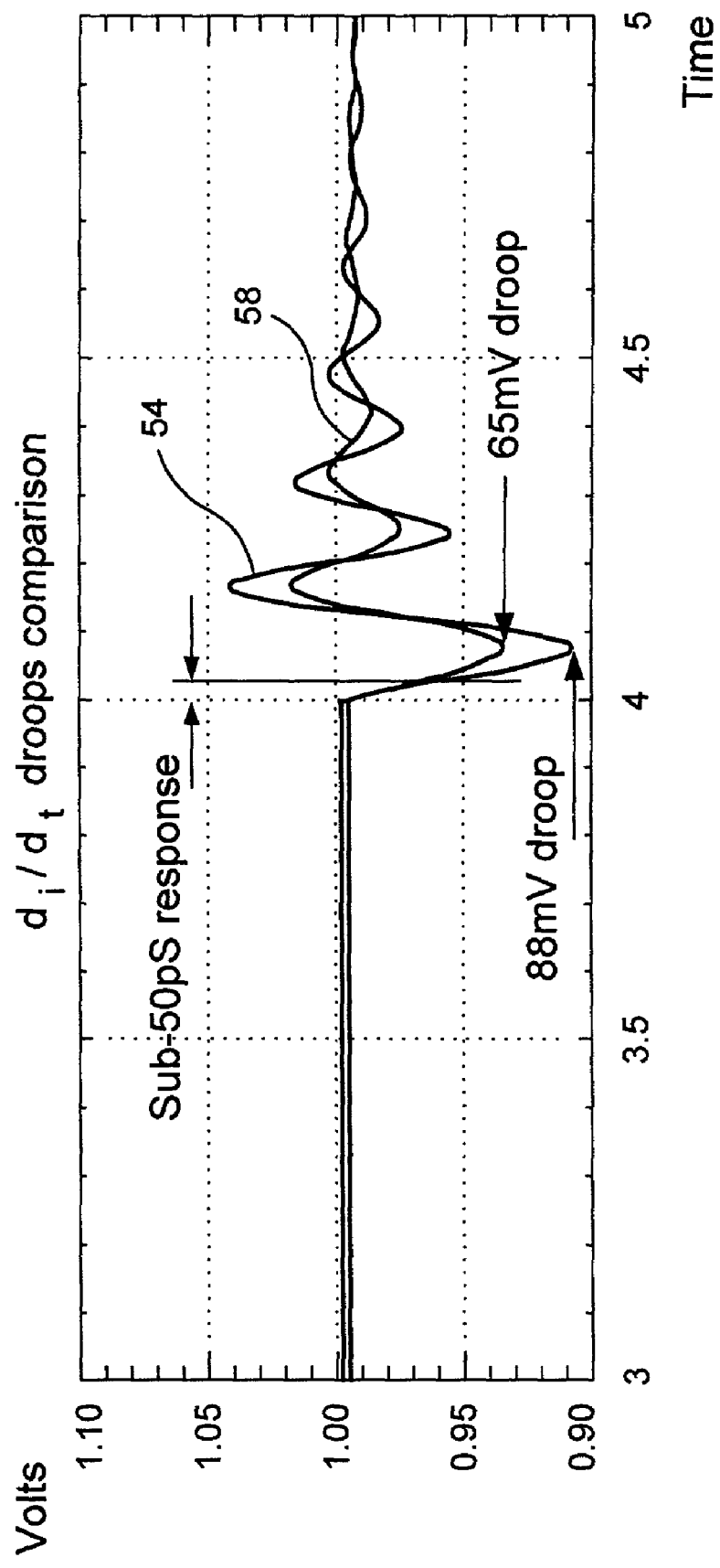
FIG. 4 is a graph showing the reduction in di/dt voltage droops using the system and method of the present invention.

FIG. 4 shows a graph of output supply voltage over time that compares the di/dt response of a conventional voltage regulation system and the hybrid voltage regulation arrangement according to the present invention. A first curve 54 indicates a droop in voltage in response to a high di/dt event when the conventional voltage regulation module arrangement is used. As shown, the magnitude of the droop reaches as high as 88 mV. In contrast, the second curve 58, representing the response of the hybrid voltage regulation system, shows a dampened di/dt voltage droop having a maximum magnitude of 65 mV, amounting to over a 25 percent improvement in di/dt response over the conventional system.

In the foregoing description, the system and method of the invention have been described with reference to a number of examples that are not to be considered limiting. Rather, it is to be understood and expected that variations in the principles of the system and method herein disclosed may be made by one skilled in the art, and it is intended that such modifications, changes, and/or substitutions are to be included within the scope of the present invention as set forth in the appended claims.

What is claimed is:

1. An apparatus comprising:
    a voltage regulation module coupled to an integrated circuit die having an exposed surface layer, the voltage regulation module including:
        an interposer layer including voltage regulator elements, the interposer layer having surface dimensions approximately matching the exposed surface layer of the integrated circuit die and being adapted to be stacked surface-to-surface with the exposed surface layer; and
        interconnect elements adapted to couple the interposer layer to the integrated circuit die.

2. The apparatus of claim 1, wherein the interposer layer is thinned to enable thru-vias to penetrate completely through the interposer.

3. The apparatus of claim 1, wherein the voltage regulator elements include both linear regulator elements and switching regulator elements, the linear regulator elements being situated to provide voltage regulation to areas on the integrated circuit die that intermittently demand high current levels.

4. The apparatus of claim 3, further comprising:
    passive circuit elements, the passive circuit elements including at least one of metal-insulator metal capacitors and high-bandwidth inductors.

5. An apparatus comprising:
a voltage regulation module directly coupled to an exposed surface layer of an integrated circuit die including:
a two-dimensional hybrid array of voltage regulator elements, the voltage regulator elements including a minority of linear regulator elements and a majority of switching regulator elements, the two-dimensional array converting a supply voltage into a regulated voltage and providing the regulated voltage to the integrated circuit die;
wherein the minority of linear regulator elements supply regulated voltage to areas on the integrated circuit die that intermittently demand high current levels.

6. The apparatus of claim 5, wherein the two-dimension hybrid array is embedded in an interposer adapted to interface two-dimensionally with the exposed surface layer.

7. The apparatus of claim 6, further comprising:
thru-vias penetrating through and insulated from the interposer, the thru-vias being adapted to connect the exposed surface of the integrated circuit die with a substrate.

8. The apparatus of claim 6, wherein the hybrid array of voltage regulator elements includes both linear regulator elements and switching regulator elements, the linear regulator elements being situated to interface with and provide voltage regulation to areas on the integrated circuit die that intermittently demand high current levels.

9. The apparatus of claim 8, further comprising:
passive circuit elements, the passive circuit elements including at least one of metal-insulator metal capacitors and high-bandwidth inductors.

10. A system comprising:
a power supply;
a substrate coupled to the power supply;
an integrated circuit die having an exposed circuit side; and
an interposer situated between the substrate and the integrated circuit die, the interposer having voltage regulator elements for receiving voltage from the power supply and for down-converting the voltage from the power supply into a regulated voltage, the interposer delivering the regulated voltage to the integrated circuit die;
wherein the voltage regulator elements include a minority of linear regulator elements and a majority of switching regulator elements.

11. The system of claim 10, wherein the interposer and the exposed circuit side of the integrated circuit die are bonded in a flip-chip fashion.

12. The system of claim 11, further comprising:
thru-vias penetrating through and insulated from the interposer, the thru-vias being connecting the exposed circuit side of the integrated circuit die directly to the substrate;
wherein the interposer includes a circuit side coupled to the exposed circuit side of the integrated circuit die with short solder ball elements, and a reverse side coupled to the substrate with interconnect elements.

13. The system of claim 11, wherein the linear regulator elements are situated to provide voltage regulation to areas on the integrated circuit die that intermittently demand high current levels.

14. A method comprising:
coupling an array of distributed low bandwidth and high bandwidth voltage regulators surface-to-surface to an integrated circuit die;
determining locations of hot spots on the integrated circuit die; and
placing the high bandwidth voltage regulators on locations of the array corresponding to the hot spot locations on the integrated circuit die.

15. The method of claim 14, further comprising:
minimizing interconnect distances between the voltage regulators and the integrated circuit die.

16. The method of claim 15, further comprising:
embedding the array of distributed high bandwidth and low bandwidth voltage regulators in an interposer having a circuit side and a reverse side;
bonding the circuit side of the interposer to the integrated circuit die in a flip-chip fashion; and
coupling the reverse side of the interposer to a substrate coupled to a power supply.

17. The method of claim 14, wherein the high bandwidth voltage regulators are linear regulators, and the low bandwidth voltage regulators are switching regulators.

18. The method of claim 15, wherein solder ball elements interconnect the interposer and the integrated circuit die.

19. The method of claim 15, wherein copper-to-copper interconnects couple the interposer and the integrated circuit die.

20. The method of claim 16, further comprising:
coupling the integrated circuit die directly to the substrate with insulated thru-vias passing through the interposer.

* * * * *